United States Patent
Ran et al.

(10) Patent No.: US 8,935,141 B2
(45) Date of Patent: Jan. 13, 2015

(54) METHOD OF GENERATING A HEX-DOMINANT MESH OF A FAULTED UNDERGROUND MEDIUM

(75) Inventors: Longmin Ran, Rueil Malmaaison (FR); Abdallah Benali, Suresnes (FR); Houman Borouchaki, Paris (FR); Chakib Bennis, Rueil-Malmaison (FR)

(73) Assignee: IFP, Rueil-Malmaison Cedex (FR)

( * ) Notice: Subject to any disclaimer, the term of this patent is extended or adjusted under 35 U.S.C. 154(b) by 792 days.

(21) Appl. No.: 12/837,781

(22) Filed: Jul. 16, 2010

(65) Prior Publication Data
US 2011/0015910 A1    Jan. 20, 2011

(30) Foreign Application Priority Data
Jul. 16, 2009 (FR) .................................. 09 03501

(51) Int. Cl.
   *G06G 7/57*       (2006.01)
   *G06T 17/20*     (2006.01)
   *G06F 17/50*     (2006.01)

(52) U.S. Cl.
   CPC ............. *G06T 17/20* (2013.01); *G01V 2210/66* (2013.01); *G06F 17/5018* (2013.01)
   USPC ............................................. 703/10; 345/419

(58) Field of Classification Search
None
See application file for complete search history.

(56) References Cited

U.S. PATENT DOCUMENTS

| | | | | |
|---|---|---|---|---|
| 5,740,342 A | * | 4/1998 | Kocberber | 345/420 |
| 5,844,564 A | * | 12/1998 | Bennis et al. | 345/423 |
| 5,953,680 A | * | 9/1999 | Divies et al. | 702/5 |
| 6,078,869 A | * | 6/2000 | Gunasekera | 702/6 |
| 6,089,744 A | * | 7/2000 | Chen et al. | 703/2 |
| 6,597,995 B1 | * | 7/2003 | Cornu et al. | 702/17 |
| 6,907,392 B2 | * | 6/2005 | Bennis et al. | 703/10 |
| 7,047,165 B2 | * | 5/2006 | Balaven et al. | 703/2 |
| 7,089,166 B2 | * | 8/2006 | Malthe-Sorenssen et al. | 703/10 |

(Continued)

FOREIGN PATENT DOCUMENTS

EP    0 801 364 A2    10/1997
FR    2 802 324    12/1999

OTHER PUBLICATIONS

Z. E. Heinemann, M. Leoben, G. F. Heinemann, B. M. Tranta, "Modeling Heavily Faulted Reservoirs", pp. 1-11, 1998.*

(Continued)

*Primary Examiner* — Omar Fernandez Rivas
*Assistant Examiner* — Kibrom K Gebresilassie
(74) *Attorney, Agent, or Firm* — Antonelli, Terry, Stout & Kraus, LLP.

(57) ABSTRACT

A method having application for petroleum exploration or geological storage of generating a mesh of a faulted underground medium, comprising generating a hex-dominant mesh from faults and horizons in a form of a 3D triangulated surfaces. Each 3D triangulated surface is converted to a 2D triangulated surface onto which the faults are projected by an isometric unfolding technique. A regular two-dimensional grid pattern is generated for each 2D triangulated surface. The faults are accounted for by deforming quadrilaterals of the grid pattern intersected by projected faults. The deformed regular grid pattern is then converted to a 3D gridded surface and each quadrilateral which is crossed by a fault is converted into two triangles at a level of a diagonal. Finally, after iterating for all the 3D triangulated surfaces, the mesh is generated by creating links between the nodes of neighboring three-dimensional gridded surfaces with respect to the faults.

18 Claims, 8 Drawing Sheets

(56) References Cited

U.S. PATENT DOCUMENTS

| | | | |
|---|---|---|---|
| 7,260,508 B2* | 8/2007 | Lim et al. | 703/2 |
| 7,394,463 B2* | 7/2008 | Tani | 345/420 |
| 7,480,205 B2* | 1/2009 | Wei | 367/37 |
| 7,523,024 B2* | 4/2009 | Endres et al. | 703/6 |
| 7,565,278 B2* | 7/2009 | Li et al. | 703/10 |
| 7,634,395 B2* | 12/2009 | Flandrin et al. | 703/10 |
| 8,150,663 B2* | 4/2012 | Mallet | 703/6 |
| 8,212,814 B2* | 7/2012 | Branets et al. | 345/423 |
| 8,265,915 B2* | 9/2012 | Hsu et al. | 703/10 |
| 8,674,984 B2* | 3/2014 | Ran et al. | 345/420 |
| 8,731,875 B2* | 5/2014 | Hilliard et al. | 703/1 |
| 8,788,250 B2* | 7/2014 | Kaminsky et al. | 703/9 |
| 2003/0216897 A1* | 11/2003 | Endres et al. | 703/10 |
| 2005/0273303 A1* | 12/2005 | Flandrin et al. | 703/10 |
| 2006/0197759 A1* | 9/2006 | Fremming | 345/420 |
| 2007/0073527 A1* | 3/2007 | Flandrin et al. | 703/10 |
| 2009/0248374 A1* | 10/2009 | Huang et al. | 703/2 |
| 2010/0211370 A1* | 8/2010 | Maliassov | 703/10 |
| 2011/0106507 A1* | 5/2011 | Lepage | 703/2 |
| 2012/0022837 A1* | 1/2012 | Asbury et al. | 703/2 |
| 2012/0026167 A1* | 2/2012 | Ran et al. | 345/420 |
| 2012/0136636 A1* | 5/2012 | Kleine et al. | 703/2 |
| 2012/0215513 A1* | 8/2012 | Branets et al. | 703/2 |
| 2012/0221302 A1* | 8/2012 | Lewandowski et al. | 703/2 |
| 2013/0096899 A1* | 4/2013 | Usadi et al. | 703/10 |
| 2013/0118736 A1* | 5/2013 | Usadi et al. | 166/268 |
| 2013/0124161 A1* | 5/2013 | Poudret et al. | 703/2 |
| 2013/0218539 A1* | 8/2013 | Souche | 703/2 |
| 2014/0052427 A1* | 2/2014 | Yahiaoui et al. | 703/10 |

OTHER PUBLICATIONS

J. P. Gratier & B. Guillier, "Compatibilityconstraints on folded and faulted strata and calculation of total displacementus ing computational restoration (Unfolded program)", pp. 391-402, 1993.*

Z. E. Heinemann, M. Leoben, G. F. Heinemann, B. M. Tranta, "Modeling Heavily Faulted Reservoirs", (Herein referred as Heinemann etal), pp. 1-12, 1998.*

Z. E. Heinemann, M. Leoben, G. F. Heinemann, B. M. Tranta, "Modeling Heavily Faulted Reservoirs", (Herein referred as Heinemann et al), pp. 9-19, 1998.*

J. P. Gratier & B. Guillier, "Compatibility constraints on folded and faulted strata and calculation of total displacement using computational restoration (Unfolded program)", pp. 391-402, 1993.*

Z. E. Heinemann, M. Leoben, G. F. Heinemann, B. M. Tranta, "Modeling Heavily Faulted Reservoirs", pp. 1-11, 1998.*

Heinemann, Z. E., et al: "Modeling Heavily Faulted Reservoirs", Proceedings/SPE Symposium on Reservoir Simulation, Feb. 14-17, 1999, Houston, Tx., Feb. 14, 1999, pp. 9-19, XP009129119.

Gratier, Jean-Pierre, et al: Compatibility Constraints on Folded and Faulted Strata and Calculation of Total Displacement Using Computational Restoration (Unfold program), Journal of Structural Geology, vol. 15, Nos. 3-5, pp. 391-402, Pergamon Press, XX LNKD-DOI:10.1016/0191-8141(93)90135-W, XP009133429, ISSN: 0191-8141.

* cited by examiner

METHOD OF GENERATING A HEX-DOMINANT MESH OF A FAULTED UNDERGROUND MEDIUM

BACKGROUND OF THE INVENTION

1. Field of the Invention

The present invention relates to petroleum exploration and more particularly, to the study of fluid flows within an underground formation.

2. Description of the Prior Art

Basin modelling reconstructs the geological history of a sedimentary basin and its petroleum systems in order to help locate hydrocarbon traps, that is the reservoirs, to assess the amount and quality of the trapped hydrocarbons, and finally to assess the risks of encountering excess pressures while drilling. Reservoir simulation studies the evolution over time of the proportions of water, gas and petroleum in the reservoir so as to appreciate the cost-effectiveness, to validate or to optimize the position of the wells providing smooth operation of the reservoir development.

In times where sustainable growth and environmental protection have become essential, a third important study linked with petroleum exploration is to carry out simulations for injecting CO2 into porous media.

Basin modelling, reservoir simulation and CO2 simulation are techniques based on flow simulation in a porous medium. These simulations are performed by a partial-differential equation system by finite-volume methods on a mesh describing the geometry of the underground medium. Today, exploration is interested in complex geometry zones with many faults of random position. Automatic generation of a 3D mesh that can represent this geometrical complexity is the first essential stage towards elaboration of the simulation software, which is the flow simulator, for such a medium, from the horizons that delimit the various geological layers and the faults that intersect the horizons. The horizons and the faults are provided as surfaces, triangulated from a pattern of points. These points generally result from seismic surveys. Considering the flow simulators used in the industry, the mesh has to comprise as many hexahedral elements as possible to allow a better simulation result to be obtained, and meshing has to be done between the horizons in order to respect the infrastructure of the medium.

In the field of petroleum exploration, most current porous medium flow simulators work with regular or "Scottish Cartesian" grids. In order to try and adjust the meshes to the faults and to any heterogeneity form, as a simulation calculation support, there are known techniques such as local grid refinement, CPG grids (described in French Patent 2,747,490 for example) or grids with vertical split nodes.

The meshes described above are based on grids. They are quasi structured, that is their topology is fixed. Each internal vertex is incident to a fixed number of mesh cells and each cell is delimited by a fixed number of faces and edges. They are therefore only suited to a relatively simple geometry. For a basin simulator, for each given age, a mesh is generated by stacking layers, on a single 2D grid (map), connected by verticals. Mesh generation is advantageously very simple. However, it is impossible often to represent oblique faults.

In order to enable fault management, there are methods that first perform manual decomposition by blocks along the faults and then generate a simple mesh for each block. This approach is however not totally suited for flow simulation in a complex geometry medium for two reasons. First, the quality of the elements is not satisfactory for irregular geometries, and second, with the random presence of many faults, it is nearly impossible to perform manual decomposition of the medium processed.

In order to capture the entire complexity of the medium geometry, it is also possible to generate an entirely unstructured mesh, with a completely arbitrary topology. A vertex of the mesh can belong to any number of cells and each cell can have any number of edges or faces. Meshes of PErpendicular BIssector (PEBI) or Voronoi type, are proposed in the following document.

Z. E. Heinemann, G. F. Heinemann and B. M. Tranta, "Modelling Heavily Faulted Reservoirs", Proceedings of SPE Annual Technical Conferences, pages 9-19, New Orleans, La., September 1998, SPE.

Although unstructured meshes describe complex geometries well, they, unlike structured meshes, are very difficult to construct, to handle and to store, unlike structured meshes. In order to reconcile the advantages and the drawbacks thereof, approaches referred to as "hybrid" have been proposed, which use unstructured meshes only in complex geometry zones. However, joining together unstructured and structured meshes remains a difficult task.

Finally, there are four main categories of methods for automatic generation of hex-dominant meshes:
- octree/grid methods,
- plastering methods,
- block methods,
- sweep methods.

The principle of octree/grid methods wraps the domain to be meshed in a grid and subdivides a cube recursively until the geometry of the domain is well captured. That is, until the cell size criterion, which essentially depends on the minimum distance of the points from the contour and on the available resources, is met. Tetrahedral or hexahedral elements are then created at the intersection of the surfaces of the domain by following some intersection patterns.

Octree/grid methods are advantageously computer automated and applicable whatever the geometry. However, the mesh that is generated is not in accordance with the shape of the domain. Furthermore, when the contour is irregular, a time consuming intersection calculation is inevitable and a substantial expansion of the number of cells may occur to reach a good boundary approximation precision.

Plastering methods fill the volume of the domain with 3D elements from the initial surface front of the model by advancing towards a center by starting from the new front that has been constructed. The procedure is complete once the front becomes empty.

In plastering algorithms, it is difficult to determine the order of front advance, and to detect and to process the collision and divergence zones. These methods are thus considered to not be robust especially when complex geometries are concerned. As a result, obtaining a mesh of good quality is not guaranteed.

Block approaches decompose the concerned domain into coarse blocks having an elementary topology (triangle, quadrangle, tetrahedron, pentahedron and hexahedron and then meshing each block independently using algebraic methods or by solving PDEs (partial-differential equations), and in eventually joining the blocks together to form the global mesh of the entire domain.

The major advantage of block methods is that it is trivial to mesh once the partition is achieved. Furthermore, it is possible to solve in parallel the problem on each block. However, the partition itself remains very time consuming and difficult to be automated, and inter-block interfacing has to be carefully managed to ensure conformity of the final joining.

Sometimes considered to be "2.5D meshes", sweep methods "sweep" a quadrilateral mesh by following a curve. Regular hexahedra layers are formed at specified intervals using the same topology as the quadrilateral mesh. This technique can be generalized in order to mesh volumes of some classes by definition of the source and target surfaces.

The meshes generated by sweep methods are automatically aligned with the interfaces, which is of course a great advantage. However, these methods are not well suited to the simulation of the porous medium, where the topology change can go from one horizon surface to the next due to the interference of the faults.

SUMMARY OF THE INVENTION

The invention relates to a method of generating a three-dimensional mesh of an underground medium, by accounting for the deformations caused by the faults of the medium, and by overcoming the aforementioned problems. The method provides this result by constructing regular grid patterns for each geological horizon, then deforming the regular grid patterns according to the faults of the medium and then achieving a correspondence between each grid pattern to construct a mesh containing a maximum number of hexahedral cells.

The invention relates to a method of generating a mesh of an underground medium comprising at least one sedimentary layer crossed by at least one fault with the layer being vertically delimited by two geological horizons discretized by first and second triangulated three-dimensional surfaces. The method comprises the following stages:

converting the first three-dimensional surface into a triangulated two-dimensional surface onto which the fault is projected, by an isometric unfolding technique with the projected fault forming segments describing an open curve;

generating a regular two-dimensional grid pattern for each triangulated two-dimensional surface;

accounting for the fault within the regular grid pattern by deforming the quadrilaterals of the grid pattern intersected by the curve;

converting the deformed regular grid pattern into a three-dimensional gridded surface and converting the gridded surface into two triangles at each quadrilateral crossed by the fault at the level of a diagonal;

repeating the previous stages for the second triangulated three-dimensional surface while keeping an identical number of quadrilaterals in each direction;

generating the mesh of the underground medium by creating links between the nodes of neighbouring three-dimensional gridded surfaces with respect to the fault.

According to the invention, if the medium comprises more than one sedimentary layer, the mesh can be constructed by reiterating layer by layer.

The regular grid pattern can be generated by means of the following stages:

selecting four points at a border of the 2D surface and defining four curves at the border;

selecting dimensions of the grid pattern (N, M) and alternately discretizing each one of the four curves according to the dimensions; and applying Coons' formula to construct the grid pattern.

In order to take account of the fault in the regular grid pattern, the following stages can be carried out:

determining a first edge of the grid pattern intersected by an open curve, by travelling along the curve segment by segment and starting from one end of the open curve; and displacing an end of an intersected edge that is closest to the intersection point towards the intersection point.

According to an embodiment, before displacing the closest end, it is necessary to determine that this displacement does not generate a quadrilateral at least one angle of which is greater than a fixed angle threshold and, if so, the other end of the intersected edge is displaced.

If the medium comprises several faults, the faults within the regular grid pattern can be taken into account by carrying out the following stages:

IF this displacement does not generate a quadrilateral at least one angle of which is greater than a fixed angle threshold, and IF this end has not been displaced yet;

THEN displacing the end of the edge that is the closest to the intersection point towards the intersection point;

ELSE

IF this displacement does not generate a quadrilateral at least one angle of which is great than a fixed angle threshold, and IF this end has not been displaced yet;

THEN displacing the end of the edge that is the closest to the intersection point towards said intersection point;

ELSE

IF this end has not been displaced yet;

THEN displacing the other end towards the intersection point;

ELSE refining the mesh until one end can be displaced, and displacing this end.

According to the invention, the following stages can be carried out to refine the mesh:

adding a new node to the mesh which corresponds to an intersection point between a fault and the edge for which no end can be displaced;

if the edge is vertical, splitting a complete row of the grid pattern containing the intersection point, by adding a succession of horizontal edges, in all quadrilaterals of the row with a succession of edges passing through the intersection point;

if the edge is horizontal, splitting a complete column of the grid pattern containing the intersection point, by adding a succession of vertical edges, in all the quadrilaterals of the column with the succession of edges passing through the intersection point.

The regular grid pattern can be converted to a three-dimensional gridded surface by carrying out the following stages:

for each node that is not located on a fault, determining coordinates thereof from barycentric coordinates of the node in a reference frame defined by a triangle of the 2D triangulated surface to which the node not located in a fault belongs, for each node located on a fault, determining coordinates thereof from curvilinear abscissas measured on the fault; and establishing connectivities between the nodes so as to maximize a number of quadrilaterals with only quadrilaterals for which a fault passes through it's a diagonal thereof are divided into two triangles.

Finally, links can be created between the nodes by linking each node of each three-dimensional gridded surface having the same coordinates i, j, and if a fault intersects this link, a node is linked to the fault by considering a direction of a neighbouring node.

The method of the invention notably applies to the study of displacement of fluids such as hydrocarbons in a reservoir, or underground reservoir, crossed by faults. These studies are carried out within the context of basin modelling, reservoir simulation and/or CO2 injection simulations in an underground formation.

BRIEF DESCRIPTION OF THE DRAWINGS

Other features and advantages of the method according to the invention will be clear from reading the description hereafter of embodiments given by way of non limitative example, with reference to the accompanying figures wherein:

FIGS. 7 to 11 show a sequence of procedures of the methodology of the present invention, by application to a real case; wherein

DETAILED DESCRIPTION OF THE INVENTION

The invention relates to a method of generating a three-dimensional mesh of an underground medium, by taking into account the deformations induced by the faults of the medium, and comprising a maximum number of hexahedral cells. The mesh is thus suited for study of the flows within the medium. Coupled with a flow simulator which is computer based, the invention provides a technique for evaluating, in accordance with a predetermined computer based numerical scheme, fluid flows in a porous medium of complex geometry in the presence of the faults. The underground medium comprises at least one sedimentary layer crossed by at least one fault. A sedimentary layer is vertically delimited by two geological horizons discretized by two triangulated three-dimensional surfaces.

Figure 7:
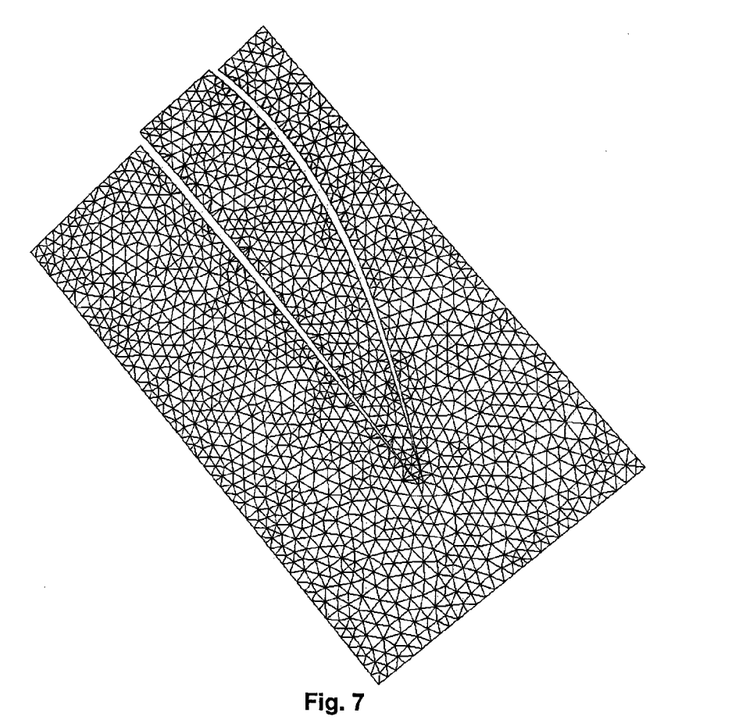
Figure 8:
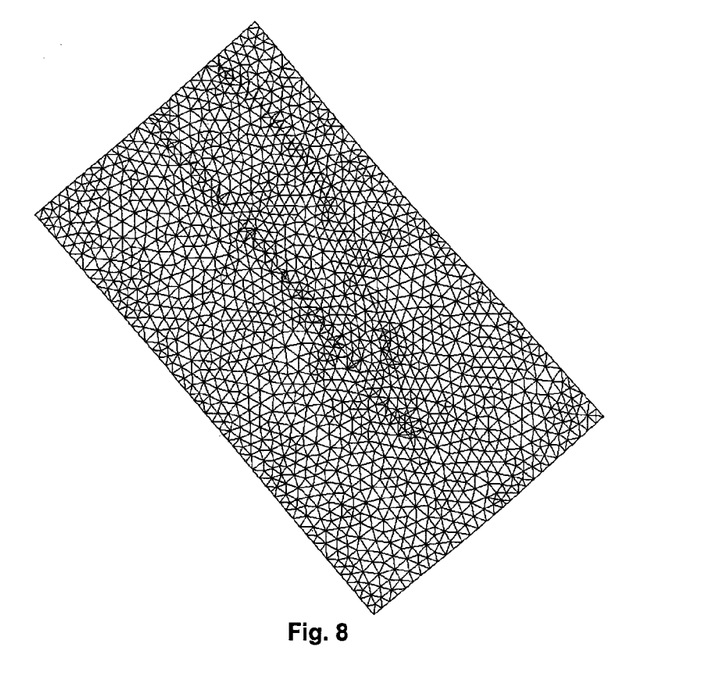
FIG. 8 shows the same horizon unfolded.
Figure 9:
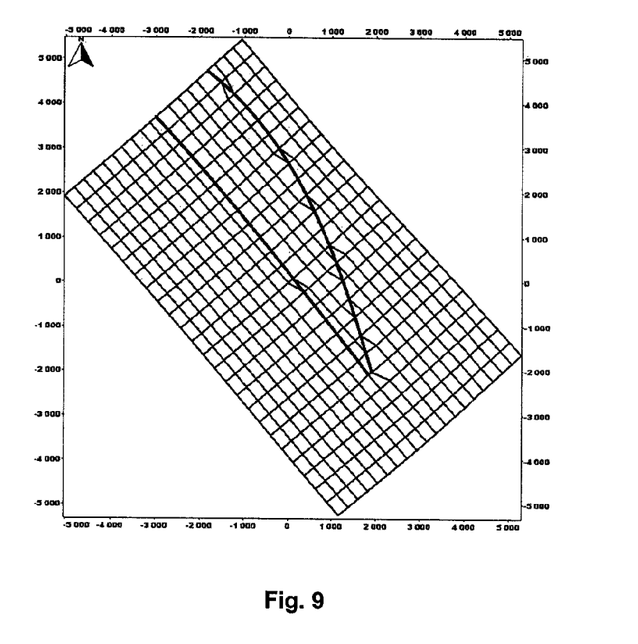
FIG. 9 shows the grid pattern generated on the unfolded horizon calibrated with the faults.
Figure 10:
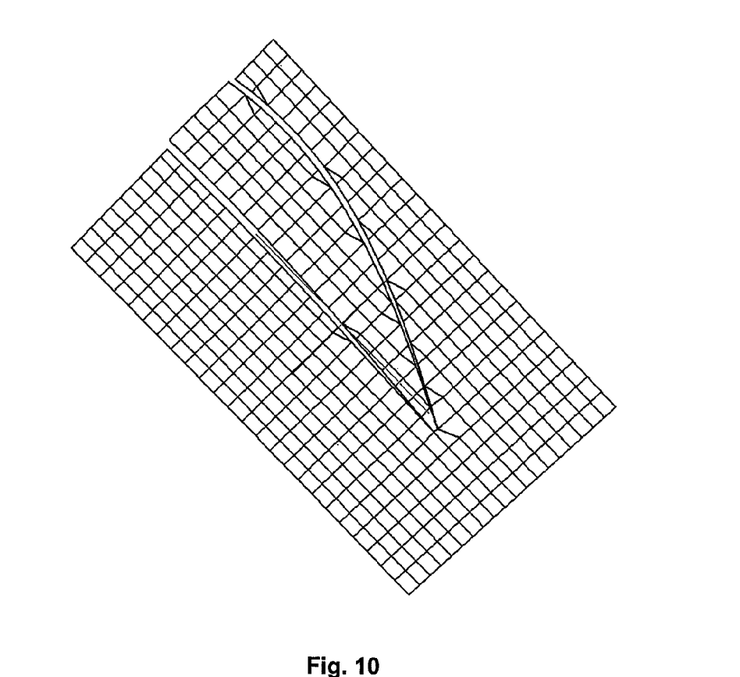
FIG. 10 shows the grid pattern after transfer to a 3D real horizon.
Figure 11:
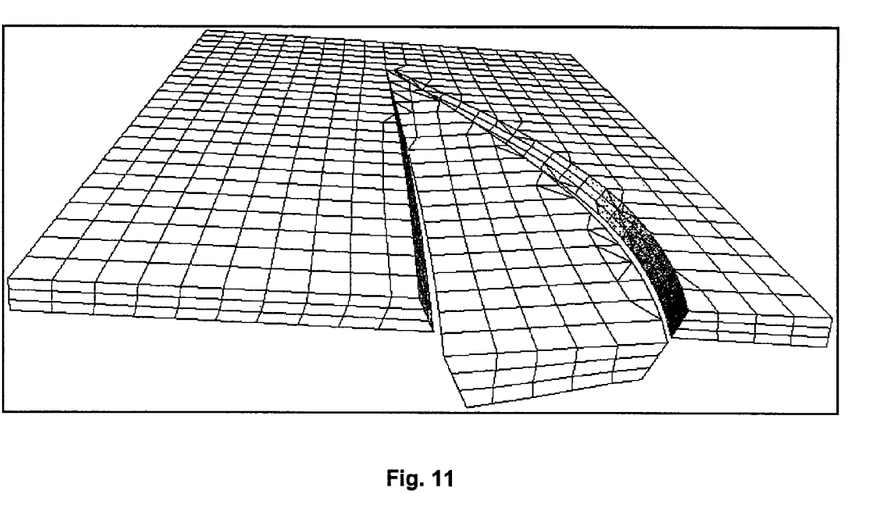
FIG. 11 shows the hex-dominant mesh generated by matching two neighboring horizons.

FIGS. 7 to 11 illustrate the various stages of the method for generating the mesh of the underground medium having first and second triangulated three-dimensional surfaces. It comprises the following stages:

1. Converting the first triangulated three-dimensional surface to a triangulated two-dimensional surface onto which the fault is projected, by an isometric unfolding technique with the projected fault forming segments describing an open curve;

2. Generating a regular two-dimensional grid pattern for each triangulated two-dimensional surface;

3. Accounting for the fault within the regular grid pattern by deforming quadrilaterals of the grid pattern intersected by the curve;

4. Converting the deformed regular grid pattern into a three-dimensional gridded surface and converting into two triangles each quadrilateral crossed by the fault at a level of a diagonal;

5. Repeating the previous stages for the second triangulated three-dimensional surface while maintaining an identical number of quadrilaterals in each direction; and 6. Generating the mesh of the underground medium by creating links between the nodes of neighbouring three-dimensional gridded surfaces with respect to the fault.

1—Isometric Unfolding Stage

This stage unfolds isometrically the triangulated 3D surfaces so as to obtain a triangulated 2D surface. It allows joining tears in the faults present on the triangulated 3D surfaces.

What is referred to as "unfolding" is the conversion of a 3D surface into a 2D surface (an operation which flattens a surface). This conversion is "isometric" when it maintains the measurements, such as lengths of the edges, and therefore the surface areas such as the areas of the triangles.

Tools and methods are known for carrying out unfolding of isometric surfaces. The method according to the invention does not depend on the type of method.

2—Gridding Stage

This stage generates a regular 2D grid pattern from a border of the triangulated 2D surface. What is referred to as a grid is a plane surface (set of lines and main points in a figure) having two families of perpendicular lines delimiting squares.

This regular grid is generated by the following stages:

Selecting four points at a border of the triangulated 2D surface to define four curves at the border, referred to as "border curves," connecting the four points. The four points are preferably those at the level at which the border forms the smallest angles which are referred to as "corners";

Selecting dimensions of the grid pattern (two integers denoted by N and M) and alternately discretizing each one of the four curves according to the dimensions. For all the grid patterns, one corner is matched and the border curves are oriented in such a way that the domain is on the left. The domain is a mathematical term and is the geometrical shape to be meshed. This stage orients all the horizons in the same way to facilitate the final stage which horizon matching. The border curves are then subdivided into N or M segments of constant length with N and M being the same as the grid pattern below;

Applying the discretized version of Coons' formula to construct the grid pattern based on the unfolded horizon ((triangulated 2D surface).

Coons' formula is described as follows:

Considering four parametric curves $f1(u)$, $f2(u)$, $g1(v)$, $g2(v)$ ($0 \le u, v \le 1$) defining four contiguous edges, Coons' formula calculates the tightest surface passing through the four edges (that interpolates these edges):

$$S(u,v)=(1-u)g1(v)+ug2(v)+(1-v)f1(u)+vf2(u)-[(1-u)(1-v)P(0,0)+((1-u)vP(0,1)+u(1-v)P(1,0)+uvP(1,1)]$$

Vertices $P(i,j)$ are the four corners of the surface.

It is then possible to obtain a regular mesh $N \times M$ of this surface through simple sampling by taking as the vertices points $S(i,j)$ corresponding to $ui=i/(N-1)$, $vj=j/(M-1)$, $i=0$ to $N-1$, $j=0$ to $M-1$. The formula restricted to the mesh points becomes:

$$S(i, j) = \left(1 - \frac{i}{N-1}\right)g1(j) + \frac{i}{N-1}g2(j) + \left(1 - \frac{j}{M-1}\right)f1(i) +$$
$$\frac{j}{M-1}f2(i) - \left[\left(1 - \frac{i}{N-1}\right)\left(1 - \frac{j}{M-1}\right)P(0,0) +\right.$$
$$\left(1 - \frac{i}{N-1}\right)\frac{j}{M-1}P(0,1) + \frac{i}{N-1}\left(1 - \frac{j}{M-1}\right)P(1,0) +$$
$$\left.\frac{i}{N-1}\frac{j}{M-1}P(1,1)\right]$$

3—Stage of Calibrating the Faults on the Grid Pattern

Taking a fault into account deforms the mesh so that it is in accordance with the underground medium to be meshed. In fact, if a fault crosses a medium, generally the sedimentary layers of this medium are broken and deformed. The mesh therefore has to account for these fault-induced deformations.

Case of a Single Fault

During this stage, the fault is taken into account within the regular grid pattern by carrying out the following stages:

Determining a first edge of the grid pattern intersected by the open curve, by travelling along this curve segment by segment and starting from one of its ends; and Displacing the end of the intersected edge that is the closest to the intersection point towards the intersection point.

Figure 1:
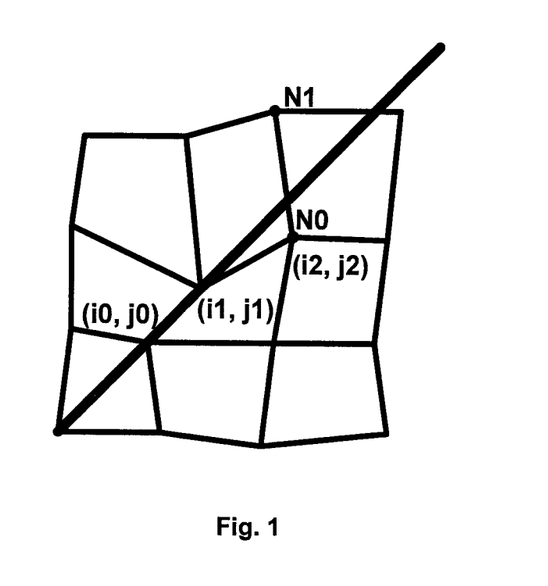
FIG. 1 shows the detection of a degenerated quadrilateral.

A difficulty may arise due to the fact that degenerated quadrilaterals can be produced by displacing the end of the intersected edge. This problem is illustrated in FIG. 1:

Let there be three nodes such that:
(i2,j2) is the node to be displaced
(i1,j1) is the node displaced just before (i2,j2)
(i0,j0) is the node displaced just before (i1,j1).

If (i0=i1 or j0=j1), then (i0,j0) and (i1,j1) form an edge (two nodes displaced successively form either a diagonal or an edge of a quadrilateral). Similarly, (i1,j1) and (i2,j2) form a second edge if (i1=i2 or j1=j2). Consequently, these two constructed edges are in the same quadrilateral if |i0−i2|=1 and |j0−j2|=1, and they are considered to be aligned if the angle between them exceeds a certain alignment threshold. This situation is not acceptable because the hexahedra having this quadrilateral as the face will be twisted. In order to overcome this difficulty, prior to displacing the closest end, it is determined if this displacement does not generate a degenerated quadrilateral. A quadrilateral is referred to as "degenerated" when at least one angle thereof is greater than a fixed angle threshold. If displacing the closest end actually generates such a quadrilateral, the other end of the intersected edge is displaced. According to the example of FIG. 1, the other end of the edge intersected by the fault is displaced instead of (i2,j2).

The method is implemented by a computer with the algorithm relative to this stage being described. The algorithm starts with the identification of the quadrilateral that contains the first point of the fault. Then, the intersection between the first segment of the fault and the edges of this quadrilateral is calculated. If no intersection is detected, the algorithm proceeds to the next segment of the fault and loops until an intersection is found. The end of the intersected edge that is the closest to the intersection point is then displaced towards this point. If the result is the formation of a degenerated quadrilateral, it is the other end of the edge that is displaced. In order to calculate the next intersection, the algorithm advances in the quadrilaterals having the last node in common, to the exclusion of those nodes having the last two nodes as a diagonal or an edge. If there is no more intersections between the current segment and the quadrilaterals to be visited, the quadrilaterals to be visited are re-assigned with what contains an end of the current segment, and the algorithm proceeds to the next segment to calculate the intersection, and so on. Finally, the two ends of the fault are calibrated with the closest nodes. By way of illustration, the algorithm can be described as follows:

```
SegmentFault ← 7 0 ;
q ← the quadrilateral containing the first point of the fault ;
quadsToVisit ← q ;
quadsToExclude ← zero ;
as long as segmentFault < total number of fault segments
    calculate the intersection of segmentFault with the quadsToVisit
by excluding the quadsToExclude ;
    n ← the good end of the intersected edge ;
    if n != −1 then
        quadsToExclude ← the quadrilaterals having n and the last
spouse node as
            edge/diagonal ;
        quadsToVisit ← the four quadrilaterals having n in common ;
    otherwise
        quadsToVisit ← the quadrilateral having the second end of the
segmentFault ;
        quadsToExclude ← zero ;
        segmentFault ← segmentFault + 1 ;
    end if
end as long as
adopt the first point of the fault with the closest corner to q ;
for each quadrilateral in quadsToVisit do
    if the last point of the fault is in the quadrilateral then
        adopt the last point of the fault with the closest corner to the
quadrilateral ;
            return ;
    end if
end for
```

Figure 2:
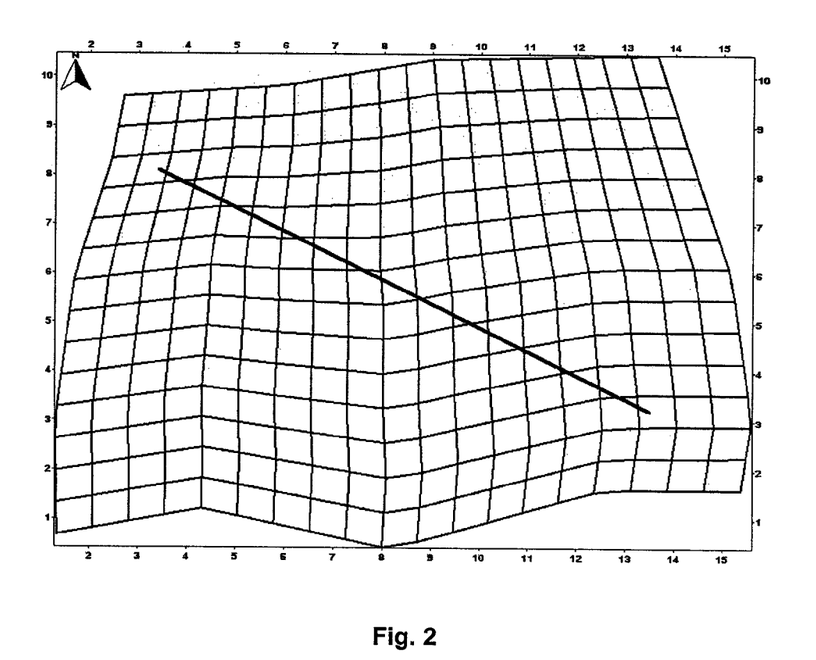
FIG. 2 shows a grid pattern of dimension 20×15 and a fault to be calibrated.
Figure 3:
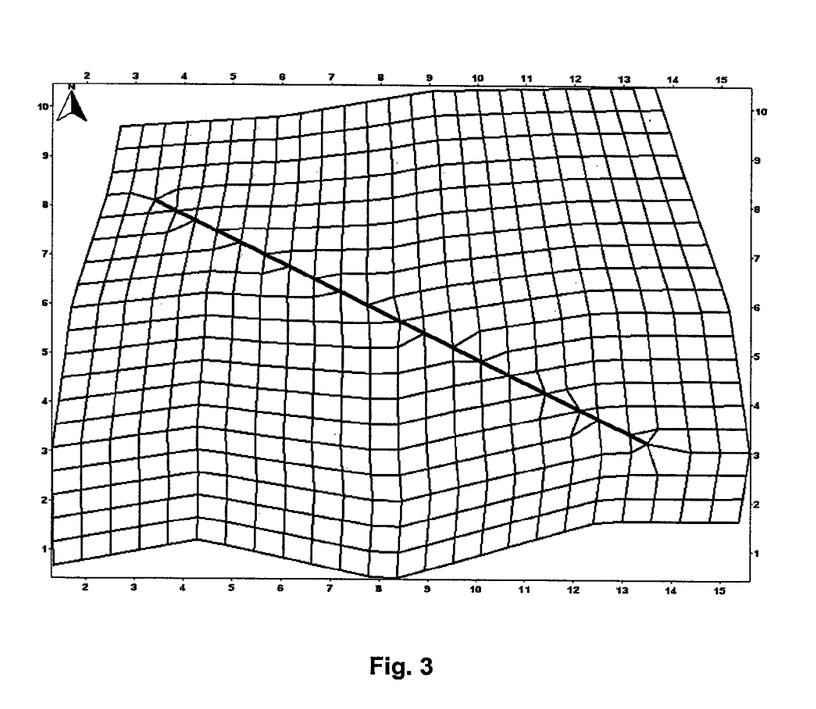
FIG. 3 shows the same grid pattern after calibration of the fault.

FIGS. 2 and 3 show a grid pattern before and after taking into account a single fault. The black line is the open curve representing the fault. It does not belong to the mesh.

Case of Multiple Faults

In the presence of multiple faults, all the nodes of the grid pattern cannot move freely because a node that has already been displaced to account for a first fault cannot be modified to account for a second fault. The calibration algorithm must therefore account for this new context, more constraining, and a refinement procedure is optionally to be performed in order to overcome this constraint.

According to the invention, multiple faults are taken into account within the regular grid pattern by carrying out the following stages:

determining a first edge of the grid pattern intersected by the open line, by travelling along the line segment by segment while starting from one end of the open line;

displacing the end of the edge that is the closest to the intersection point towards the intersection point if this displacement does not generate a quadrilateral with at least one angle of which being greater than a fixed angle threshold, and if this end has not been displaced; in the opposite case displacing the other end towards the intersection point if this end has not been displaced, in the opposite case refining the mesh until an end can be displaced, and displacing this end.

Refining the mesh can be achieved by the following stages:

adding a new node to the mesh, corresponding to an intersection point between a fault and the edge for which no end can be displaced;

if the edge is vertical, splitting the complete row of the grid pattern containing the intersection point, by adding a succession of horizontal edges, in all the quadrilaterals of the row with the succession of edges passing through the intersection point;

if the edge is horizontal, splitting the complete column of the grid pattern containing the intersection point, by adding a succession of vertical edges, in all the quadrilaterals of the column with the succession of edges passing through the intersection point.

This refinement is also applied to all the horizons which are located lower, if the horizons are processed from the lowest to the highest.

The method is implemented by a computer with the algorithm relative to this stage being described as follows. In order to describe whether a node is constrained by one or more faults, two notions are introduced: the first one is referred to as "Faulted degree of a node", and the second is referred to as "Passing faults of a node".

Faulted degree of a node: A node S is of faulted degree n if it is the intersection point of n faults. If n is zero, then no fault passes through this node. The functor that returns the faulted degree of a node is assumed to be "df" hereafter. The faulted degrees of the nodes are stored as a property of the grid pattern which is useful for the stage of accounting for the faults, to check whether a node is constrained by faults, for the grid pattern optimization stage (df=0: move the node freely; df=1: project onto the passing fault; df>=2: not move), and finally, for the phase of 3D transfer of the grid pattern, to decide when and how a node is split.

Passing faults of a node: it is the list of the faults that pass through a node. It is assumed hereafter as "Passing faults." The functor for recovering the faults passes through a node.

The global process of calibrating the multiple faults iterates from bottom to top on all the horizons to generate regular grid patterns and calibrate the faults. For each horizon, a grid pattern of the same dimension as those located lower (geologically older) is first generated, then all the intersection points between the faults and the ends of the faults are calibrated. The algorithms then iterates on all the faults to account for the faults in the mesh. When refining is necessary on a grid pattern of a horizon to adopt a fault, the grid patterns of the horizons which are already processed undergo exhaustively the same refinement, to keep a single dimension for all the grid patterns.

Concerning the data structures, considering that the number of nodes of a grid pattern on a horizon can increase due to refining, a chained list is used to represent the grid pattern in order to facilitate the addition of a new node at any position. Thus, the nodes crossed by a fault (referred to as "spouse nodes") are recorded in a chained list to allow fast insertion.

To calibrate a given fault, the algorithm seeks, segment by segment, the intersection points between the fault and the grid pattern, and the algorithm decides which nodes to displace up to these intersection points. An intersection point is calculated as follows: The algorithm starts from the first node in spouse nodes that represent the start of the first segment of the fault, the algorithm recovers the four neighboring cells of this node referred to as "current nodes", and the algorithm seeks the intersection of the first segment referred to as "current segment" with these four cells. If an intersection is found, the algorithm selects an end of the intersected edge to displace the intersected edge towards the intersection point. The neighboring cells of the node representing the intersection become the cells to visit for calculation of the next intersection with the same fault segment, to the exclusion of those having as an edge or diagonal the new spouse node and the previous one. If there is no more intersections between the current segment and the cells to visit, the cells to visit are reassigned with the cell containing the end of the current segment, and the algorithm proceeds to the next segment to calculate the intersection, and so on.

While travelling along the fault, already adopted points can be encountered, which represent for example the intersections of the fault with other faults present on the same horizon. The algorithm therefore has to check for the last adopted node whether there is a node ahead in spouse nodes. If it is the case, if the two nodes form an edge or a diagonal of a quadrilateral, the node ahead becomes the current node for calculating the cells to visit, and the algorithm proceeds to the fault segment that corresponds to this node to continue the intersection calculation. By way of illustration, the algorithm can be described as follows: Faultsegment←0;/

```
Currentnode ← first element in spouse nodes;
cellsToVisit ← the four cells having current node in common ;
cellsToExclude ← zero ;
as long as true do
  nodeAhead ← the node that follows current node in spouse nodes
  if it exists, −1 in the opposite case ;
  if Current node and nodeAhead form an edge or a diagonal then
    if nodeAhead is the last in spouse nodes then
      return ;
    end if
    n ← nodeAhead ;
    Faultsegment ← the fault segment where n lies;
  otherwise
    calculate the intersection of the fault segment with the
    quadsToVisit by excluding the quadsToExclude ;
    n ← the good end of the intersected edge ;
  end if
  if n != −1 then
    cellsToExclude← the cells having n and current node as an edge
    or diagonal ;
    Current node ← n ;
    cellsToVisit ← the four cells having current node in common ;
  in the opposite case if fault segment < total number of the
    fault segments then
    cellsToVisit ← the cell where the second end of the fault segment lies ;
    cellsToExclude ← zero ;
    Fault segment ← fault segment + 1 ;
  In the opposite case
    return ;
  end if
end as long as
```

Figure 4:
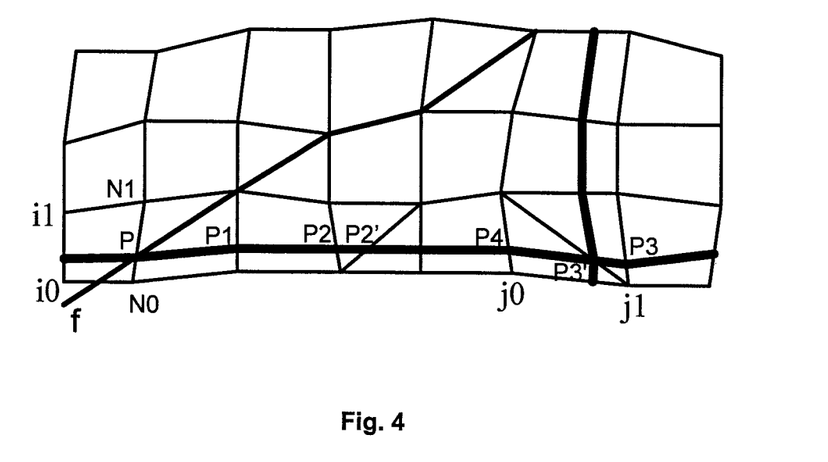
FIG. 4 shows the refining principle.

The refining process is initiated by adding as a new node an intersection point between a fault and a grid pattern. See FIG. 4: let P be the intersection point, N0N1 the edge where P lies. If this edge is horizontal, a succession of vertical edges is added between the vertical edges of indices i0 and i1. On the other hand, if this edge is vertical, the edges added are horizontal and located between the horizontal edges of indices j0 and j1. The ends of these new edges can keep the same proportion as N0P/N0N1 on their corresponding "mother" edges, but the central points are preferable for higher regularity. These ends are inserted in the chained list representing the grid pattern, with nx or ny incremented by 1.

The new edges can be intersected by the segments of the faults already adopted, represented by either an edge or a diagonal of a quadrilateral. In the first case, the intersection point is also a node (ex. P1 in FIG. 4). This node then has to be inserted in "spouse nodes" of the corresponding fault. In the second case, the end of the new edge that is the closest to the intersection point first has to be displaced (ex. Shift P2 to P2' in FIG. 4); if this end is on a fault, the other end has to be displaced. If both ends are locked by faults, refinement is required again (ex. Refine on P3' in FIG. 4).

Figure 5:
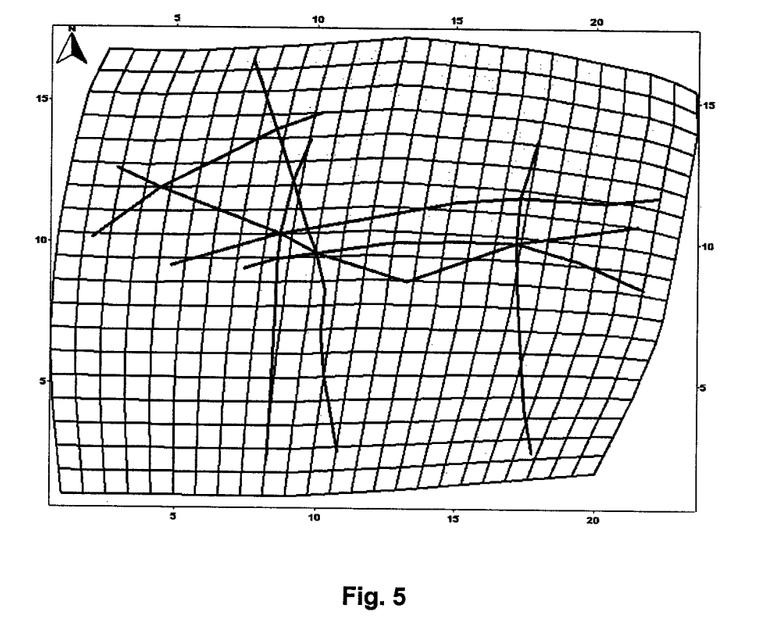
FIG. 5 shows a grid pattern of dimension 25×20 with 7 faults before calibration.
Figure 6:
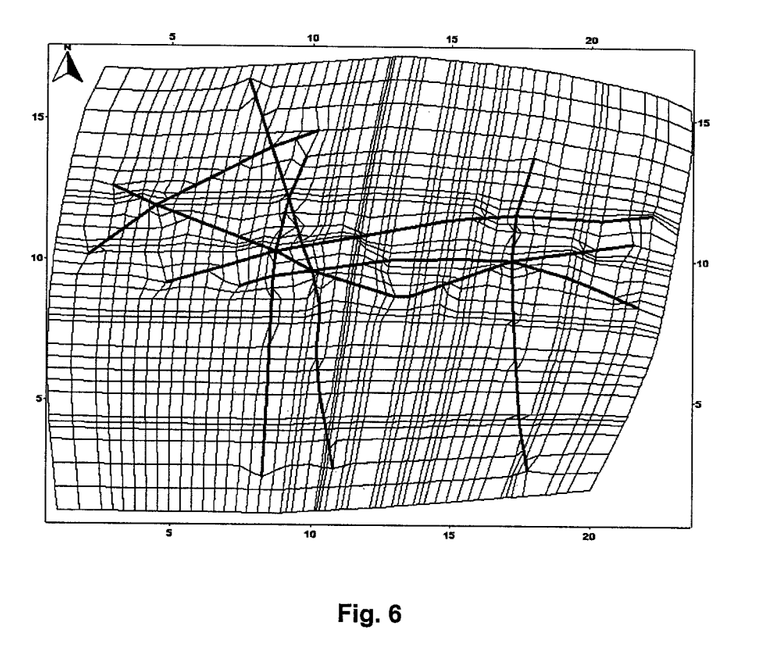
FIG. 6 shows the same grid pattern after calibration with the 7 faults where the dimension is 51×33.

FIGS. 5 and 6 show a grid pattern before and after deformation for taking seven faults into account. It can be noted that refinement has been necessary.

FIG. 9 shows a grid pattern accounting for the faults.

4—Stage of Transferring the Grid Pattern to a Real Horizon

This stage transfers the regular grid pattern, deformed to account for the faults, to a 3D real horizon.

According to the invention, it is possible to change the regular grid pattern into a three-dimensional gridded surface by a reference frame change, from the reference frame of the regular grid pattern to the reference frame of the triangulated 3D surface, in the nodes of the grid pattern. The coordinates of the nodes outside faults are determined from their barycentric coordinates in a reference frame defined by the triangle of the 2D triangulated surface to which they belong. The coordinates of the nodes located on a fault are determined from their curvilinear abscissas on the fault. The connectivities are then established so as to maximize the number of quadrilaterals, only the quadrilaterals for which a fault passes through one of its diagonals are divided into two triangles.

The following stages can be carried out in particular:
positioning the nodes in the 3D reference frame;
for each node of the grid pattern located on a fault, determining the curvilinear abscissa of the node on the fault, then transferring this node on the fault to the 3D frame by the curvilinear abscissa, and splitting the node on either side of the fault lip if necessary;
for each node of the grid pattern located outside a fault, determining the barycentric coordinates of each node of the grid pattern in a frame defined by the triangle of the 2D triangulated surface to which the node belongs and then positioning each node in a frame defined by the triangle of the 3D triangulated surface to which the node belongs, according to the barycentric coordinates; and connecting the nodes by edges to obtain a meshed 3D surface with a maximum number of quadrilaterals with only the quadrilaterals for which a fault passes through one of its diagonals being divided into two triangles, as illustrated in FIG. 10.

Figure 12:
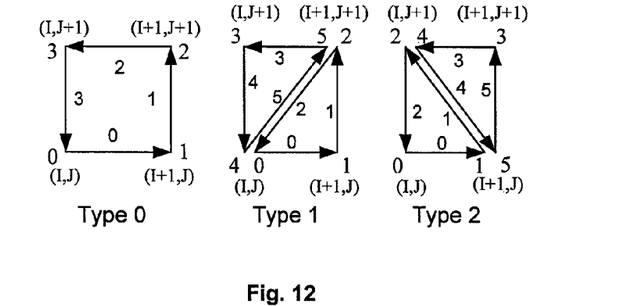
FIG. 12 shows 3 types of elements of a grid pattern transferred to a 3D horizon.

The method is implemented by a computer with the algorithm relative to this stage being described. The main structure is referred to as "SplitGrid", it represents a quasi-regular 3D grid pattern, with some nodes (I, J) split in two or more. FIG. 12 shows three types of pseudo-quadrilateral cells: a normal quadrilateral, a quadrilateral split in two triangles by the diagonal running from lower left to upper right, a quadrilateral split in two triangles by the diagonal running from lower right to upper left. The local numeration of the nodes and of the edges of the quadrilateral are also given in the figure. With this pseudo-quadrilateral cell notion, the grid pattern transferred to a 3D real horizon remains a surface IJ.

A "SplitGrid" is described by:
nx and ny are the number of columns and rows;
nodes are a list of nodes (I, J);
cells are a list of cells.
The following data are stored for a node (I, J):
a number of split nodes;
container triangle and barycentric coordinates in the triangle, if the node is not split;
for each split node a fault number, a fault side reference, a fault segment number and curvilinear abscissa of the node on this segment. When the node represents an intersection between faults, the stored data are the node number in the triangulation, the reference of the side of a fault and the other reference of the side of the other fault
for each split node the coordinates are x, y, z.
For a pseudo-quadrilateral cell, the following data are stored:
a cell type;
a number of vertices; and
a vertices table.

The algorithm starts by travelling along the nodes of the spouse 2D regular grid pattern with the faults. For each node (I, J), their passing faults are first recovered. If there are no passing faults, a container triangle of the node in the unfolded triangulation is located, the corresponding node on the 3D real horizon is calculated using the barycentric coordinates of the triangle of same number on the 3D original triangulation. If node (I, J) is on a single fault, the fault segment where this node lies in unfolded space is first recovered. The curvilinear abscissa of the node on this segment is then calculated. The two split corresponding nodes are then calculated using this curvilinear abscissa on the same segment on two sides of the fault in real space. For a node located at the intersection of the faults, its number in the triangulation is recovered and the references of the sides of faults that intersect there are recorded.

Apart from the coordinates, the information relative to the faults or to the container triangle is stored in order to facilitate generation of the volume mesh through horizon matching.

Once the nodes of the unfolded grid pattern are transferred to a real horizon, the connectivity between these nodes is established by forming pseudo-quadrilateral cells. These cells are constructed one by one, first along direction I and then direction J. The type of the current cell is first determined. Therefore a check is required whether there is a passing fault on one of the two diagonals of the quadrilateral in the unfolded grid pattern. If so, the type is 1 or 2 and in the opposite case the type is 0. The number of vertices for the current cell is then obtained according to its type, as well as index (I, J) of each vertex. With this index, it is checked if a vertex is split or not by examining the previously filed list of nodes (I, J). If all the vertices are split, the current cell is added in a temporary list that saves the cells with all its split vertices for final processing and the processing proceeds to the next cell. In the opposite case, the non-split node IJ is immediately transferred because there is only one corresponding 3D node. For each node of the current cell already transferred, the split adjacent and opposite nodes in the cell are calculated as follows such that if the non-split node and the adjacent one are on the same fault, the node is selected on the same side of the fault and in the opposite case the hundredth point on the edge consisting of the non-split node and the adjacent one is selected which is located in the unfolded triangulation and transferred to the real triangulation using the same triangle and the same barycentric coordinates. The distance between the transferred point and all the split nodes of the adjacent node IJ is then calculated and the closest node is selected as the corresponding vertex of the current cell. For the node opposite the current node (already transferred) of the diagonal, the split node on the other side of the fault is selected. This procedure reloops until all the vertices are transferred.

For a cell with all its vertices split, for each edge, the opposite edge in the neighboring cell is located and the reference of the fault where this opposite edge lies is recovered. The current edge is thus on the other side of the fault with a different reference. The corresponding split nodes are thus determined according to this reference. FIG. 10 shows the grid pattern of FIG. 9 transferred to a 3D real horizon.

5—Iteration Stage

Stages 1 to 4 are reiterated for each triangulated three-dimensional surface, by keeping the same number of quadrilaterals in each direction.

6—Stage of Matching Two Horizons

Figure 13:
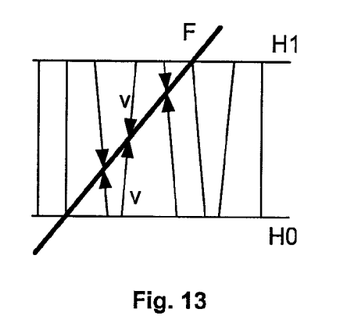
FIG. 13 shows the principle of matching two horizons.

This stage constructs a three-dimensional mesh of the medium by linking directly the nodes having the same coordinates I, J on two neighboring horizons so as to form three-dimensional cells and optionally in dividing these cells if they are crossed by the fault. If a fault intersects this link, a node is linked with the fault by considering a direction of a neighboring node. This is illustrated in FIG. 13.

Figure 14:
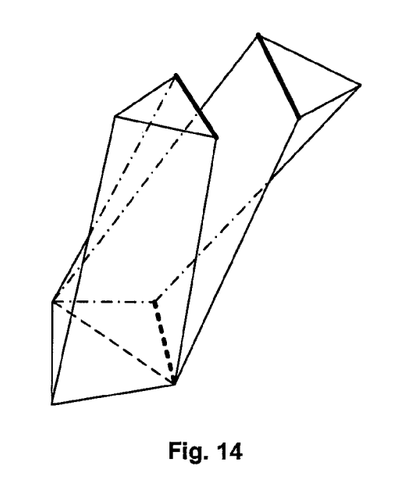
FIGS. 14 and 15 show the problem of matching two horizons in a faulted zone.

When a quadrilateral on one of two horizons is split into two triangles via a fault passing through the diagonal, the corresponding quadrilateral on the other horizon is also virtually divided in the same way and two prisms are formed. However, one of the two prisms is twisted and the interface of the fault is not respected. In FIG. 14, the segments shown in thick line are on the same fault surface. It can be seen that the quadrilateral at the bottom, left of the fault, joins two triangles at the top, left and right of the fault.

Figure 15:
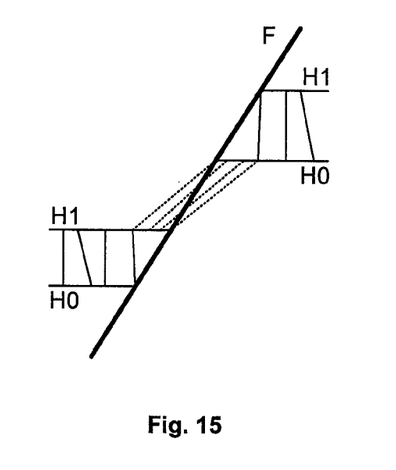

A problematic configuration is produced when the horizons on both sides of the fault glide thereon, as illustrated in FIG. 15. Elements are incorrectly constructed outside the layer formed between horizons H0 and H1 by linking the same i and j.

The malformation of the elements corresponding to the two configurations above is due to an incorrect choice of the direction of link between two horizons. The solution thus lies in the detection and correction of these wrong directions. In order to detect the presence of a wrong direction during the creation of a 3D element, it is first checked whether there is a segment linking the same I, J that crosses a fault. If so, the 3D element indeed comprises directions to be corrected and it has to be replaced by two 3D elements that follow the corrected directions. In the opposite case, it is furthermore checked if there is a fault passing through two edges of the 3D element with one on the horizon at the top and another on the other at the bottom. If so and if the local indices of these two edges are different, the element also has to be corrected. Let E be the 3D element in question, F the crossing fault, E1, E2 the two 3D elements to be created to replace E. The right directions are calculated as follows:

the algorithm first travels along all the nodes of E at H0 to find the nodes on a fault F. Let P0 be such a node. There is therefore another node having the same IJ that lies on the other side of this fault at H0, that is P0'. Let P1 be the node at H1 linked with P0 in E. Instead of linking P0 to P1, P0' is linked to P1, P0 to itself, and P0', P1 is associated with E1, P0 with E2. E2 is reduced to a tetrahedron (if E is a prism) or a prism (if E is a hexahedron). P0', P1 is recorded as a right direction of E1. This procedure is repeated on H1 to find right directions for E2, if there is no node on fault F at H0, the algorithm seeks a 3D element neighboring E by a node of E at H0. Let E' be the neighboring 3D of the selected element, P2 is the node in common and P2' is the node at H1 linked to P2 at E'. P2 is linked to P2' at E2 and P2, P2' is recorded as a right direction of E2. Similarly, the right direction of E1 is calculated when no node on fault F lies at H1.

Figure 16:
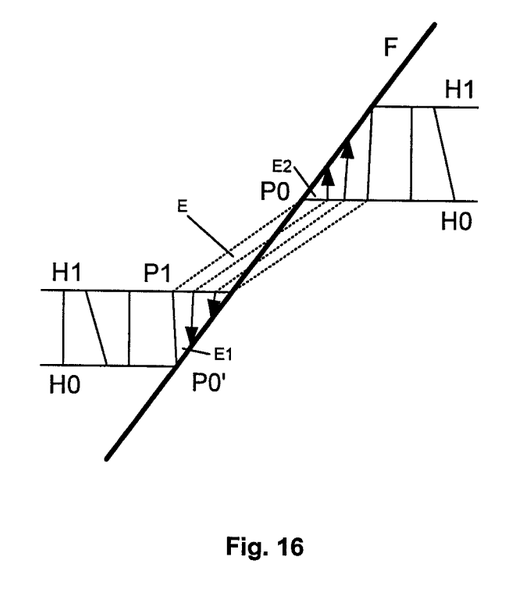
FIGS. 16 and 17 show the solution to the aforementioned problem.
Figure 17:
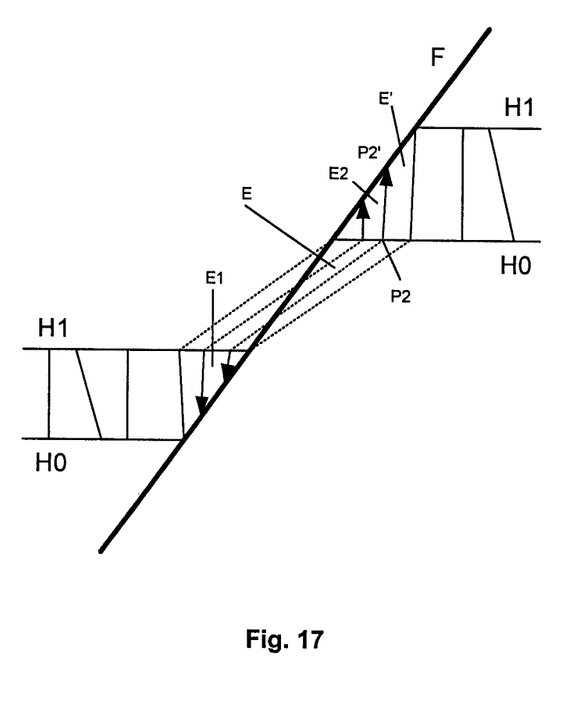

By following the corrected directions in E2, all the nodes at H0 that have not been processed are projected onto the fault surface and linked to its corresponding images. All the nodes in H1 that have not been processed are projected onto the fault surface by following the corrected directions in E1, as illustrated in FIGS. 16 and 17.

FIG. 11 illustrates the final result of a matching procedure from the grid pattern of FIG. 10.

A mesh constructed according to the invention is particularly well suited for simulating the flows within an underground medium in a complex geometry zone. The invention thus provides a precise tool for carrying out basin modelling, reservoir simulation or simulations of CO2 injection in an underground formation.

A method for simulating flows within an underground medium in a complex geometry zone comprises generating a hex-dominant mesh from the method according to the invention and then carrying out simulations by a suitable software (basin simulator or reservoir simulator) based on the generated mesh. These simulations allow optimization of petroleum field exploration, underground reservoir exploration or development, or gas injection in underground media.

The invention claimed is:

1. A method of generating a mesh of an underground medium comprising at least one sedimentary layer crossed by at least one fault, the at least one layer being vertically delimited by two geological horizons discretized by first and second triangulated three-dimensional surfaces, comprising:
    (a) converting, using a computer, the first triangulated three-dimensional surface into a triangulated two-dimensional surface onto which the at least one fault is projected, by an isometric unfolding wherein the at least one fault is projected forming segments describing an open curve;
    (b) generating a regular two-dimensional grid pattern for the first triangulated two-dimensional surface using only quadrilaterals;
    (c) accounting for the at least one fault within the regular grid pattern by deforming the quadrilaterals of the grid pattern which are intersected by the open curve;
    (d) converting the deformed regular grid pattern into a three-dimensional gridded surface and converting each quadrilateral, which is crossed by the at least one fault at a diagonal into only two triangles;
    (e) repeating steps (a)-(d) for the second triangulated three-dimensional surface while keeping an identical number of quadrilaterals in each direction; and
    (f) generating the mesh of the underground medium by creating links between each node of the two three-dimensional gridded surfaces with respect to the at least one fault; and wherein
    the medium comprises faults which are accounted for within the regular grid pattern by steps comprising IF this displacement does not generate a quadrilateral, at least one angle of the quadrilateral is greater than a fixed angle threshold, and IF this end of the edge intersected by the open curve has not been displaced yet, THEN deforming the grid displacing the end or the edge that is the closest to the intersection point towards the intersection point, ELSE IF this end has not been displaced yet, THEN deforming the grid by displacing the other end of the edge towards the intersection point, and ELSE refining the mesh until one end can be displaced, and displacing this end.

2. A method as claimed in claim 1, wherein the medium comprises sedimentary layers with the mesh being constructed by reiterating layer by layer.

3. A method as claimed in claim 1, wherein the regular grid pattern is generated by the steps comprising:
    selecting four points at a border of the first two-dimensional surface to define four curves at the border;
    selecting dimensions of the grid pattern and alternately discretizing each one of the four curves according to the dimensions; and
    using Coons' formula to construct the grid pattern.

4. A method as claimed in claim 1, wherein the fault is accounted for within the regular grid pattern by the steps comprising:
    determining a first edge of the grid pattern which is intersected by the open curve at an intersection point by travelling along the curve segment by segment while starting from one end of the open curve; and deforming the grid by displacing an end of the first edge that is closest to an intersection point towards the intersection point.

5. A method as claimed in claim 4 wherein, prior to displacing the end closest to the intersection point, determining that the displacement of the closest end, which does not generate a quadrilateral with at least one angle greater than a fixed angle threshold and, if so, displacing another end of the intersected edge.

6. A method as claimed in claim 1, wherein the mesh is refined by the steps comprising:

adding a new node to the mesh which corresponds to an intersection point between a fault and an edge for which no end can be displaced;

if the edge for which no end can be displaced is vertical, splitting a complete row of the grid pattern containing the intersection point, by adding a succession of horizontal edges, to all quadrilaterals of the complete row with the succession of edges passing through the intersection point; and if the edge is horizontal, splitting the complete column of the grid pattern containing the intersection point, by adding a succession of vertical edges, in all quadrilaterals of the column with the succession of edges passing through the intersection point.

7. A method as claimed in claim 1, wherein the regular grid pattern is converted to a three-dimensional gridded surface by the steps comprising:

for each node that is not located on a fault, determining coordinates thereof from barycentric coordinates of each node in a reference frame defined by a triangle of the two-dimensional triangulated surface to which the triangle belongs;

for each node located on a fault, determining coordinates thereof from a curvilinear abscissas measured on the fault; and establishing connectivities between each node to maximize a number of quadrilaterals for only quadrilaterals for which a fault passes through a diagonal of each quadrilateral which is divided into only two triangles.

8. A method as claimed in claim 2, wherein the regular grid pattern is converted to a three-dimensional gridded surface by the steps comprising:

for each node that is not located on a fault, determining coordinates thereof from barycentric coordinates of each node in a reference frame defined by a triangle of the two-dimensional triangulated surface to which the triangle belongs;

for each node located on a fault, determining coordinates thereof from a curvilinear abscissas measured on the fault; and establishing connectivities between each node to maximize a number of quadrilaterals for only quadrilaterals for which a fault passes through a diagonal of each quadrilateral which is divided into only two triangles.

9. A method as claimed in claim 3, wherein the regular grid pattern is converted to a three-dimensional gridded surface by the steps comprising:

for each node that is not located on a fault, determining coordinates thereof from barycentric coordinates of each node in a reference frame defined by a triangle of the two-dimensional triangulated surface to which the triangle belongs;

for each node located on a fault, determining coordinates thereof from a curvilinear abscissas measured on the fault; and establishing connectivities between each node to maximize a number of quadrilaterals for only quadrilaterals for which a fault passes through a diagonal of each quadrilateral which is divided into only two triangles.

10. A method as claimed in claim 4, wherein the regular grid pattern is converted to a three-dimensional gridded surface by the steps comprising:

for each node that is not located on a fault, determining coordinates thereof from barycentric coordinates of each node in a reference frame defined by a triangle of the two-dimensional triangulated surface to which the triangle belongs;

for each node located on a fault, determining coordinates thereof from a curvilinear abscissas measured on the fault; and establishing connectivities between each node to maximize a number of quadrilaterals for only quadrilaterals for which a fault passes through a diagonal of each quadrilateral which is divided into only two triangles.

11. A method as claimed in claim 5, wherein the regular grid pattern is converted to a three-dimensional gridded surface by the steps comprising:

for each node that is not located on a fault, determining coordinates thereof from barycentric coordinates of each node in a reference frame defined by a triangle of the two-dimensional triangulated surface to which the triangle belongs;

for each node located on a fault, determining coordinates thereof from a curvilinear abscissas measured on the fault; and establishing connectivities between each node to maximize a number of quadrilaterals for only quadrilaterals for which a fault passes through a diagonal of each quadrilateral which is divided into only two triangles.

12. A method as claimed in claim 6, wherein the regular grid pattern is converted to a three-dimensional gridded surface by the steps comprising:

for each node that is not located on a fault, determining coordinates thereof from barycentric coordinates of each node in a reference frame defined by a triangle of the two-dimensional triangulated surface to which the triangle belongs;

for each node located on a fault, determining coordinates thereof from a curvilinear abscissas measured on the fault; and establishing connectivities between each node to maximize a number of quadrilaterals for only quadrilaterals for which a fault passes through a diagonal of each quadrilateral which is divided into only two triangles.

13. A method as claimed in claim 7, wherein links are created between each node by linking each node of each three-dimensional gridded surface having identical coordinates and if a fault intersects any link, a node is linked to the fault by considering a direction of a neighboring node.

14. A method as claimed in claim 8, wherein links are created between each node by linking each node of each three-dimensional gridded surface having identical coordinates and if a fault intersects any link, a node is linked to the fault by considering a direction of a neighboring node.

15. A method as claimed in claim 9, wherein links are created between each node by linking each node of each three-dimensional gridded surface having identical coordinates and if a fault intersects any link, a node is linked to the fault by considering a direction of a neighboring node.

16. A method as claimed in claim 10, wherein links are created between each node by linking each node of each three-dimensional gridded surface having identical coordinates and if a fault intersects any link, a node is linked to the fault by considering a direction of a neighboring node.

17. A method as claimed in claim 11, wherein links are created between each node by linking each node of each three-dimensional gridded surface having identical coordinates and if a fault intersects any link, a node is linked to the fault by considering a direction of a neighboring node.

18. A method as claimed in claim 12, wherein links are created between each node by linking each node of each three-dimensional gridded surface having identical coordinates and if a fault intersects any link, a node is linked to the fault by considering a direction of a neighboring node.

* * * * *